(12) United States Patent
Sekine et al.

(10) Patent No.: US 8,373,222 B2
(45) Date of Patent: Feb. 12, 2013

(54) NONVOLATILE SEMICONDUCTOR MEMORY DEVICE WITH ALTERNATELY STACKED ISOLATION DIELECTRIC FILMS AND ELECTRODE FILMS

(75) Inventors: Katsuyuki Sekine, Kanagawa-ken (JP); Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 399 days.

(21) Appl. No.: 12/543,685

(22) Filed: Aug. 19, 2009

(65) Prior Publication Data

US 2010/0059811 A1    Mar. 11, 2010

(30) Foreign Application Priority Data

Sep. 10, 2008 (JP) ................. 2008-231904

(51) Int. Cl.
*H01L 29/792* (2006.01)
(52) U.S. Cl. ............... 257/324; 257/319; 257/E29.309; 257/E21.21; 365/185.05
(58) Field of Classification Search .................. 257/324, 257/319, E29.309, E21.21; 365/185.05
See application file for complete search history.

(56) References Cited

U.S. PATENT DOCUMENTS

| 5,917,211 | A  | * | 6/1999 | Murata et al. ................. 257/296 |
| 7,732,891 | B2 | * | 6/2010 | Tanaka et al. ................. 257/522 |
| 2002/0179960 | A1 | * | 12/2002 | Kang et al. .................... 257/315 |
| 2007/0252201 | A1 | * | 11/2007 | Kito et al. ..................... 257/331 |
| 2008/0211004 | A1 | * | 9/2008 | Ozawa et al. ................. 257/315 |
| 2008/0253183 | A1 |   | 10/2008 | Mizukami et al. |
| 2009/0230458 | A1 | * | 9/2009 | Ishiduki et al. ............... 257/324 |
| 2009/0283819 | A1 | * | 11/2009 | Ishikawa et al. .............. 257/324 |
| 2009/0294828 | A1 | * | 12/2009 | Ozawa et al. ................. 257/319 |
| 2009/0294836 | A1 | * | 12/2009 | Kiyotoshi ...................... 257/324 |
| 2009/0321813 | A1 | * | 12/2009 | Kidoh et al. .................. 257/324 |
| 2010/0034028 | A1 | * | 2/2010 | Katsumata et al. ....... 365/185.28 |
| 2010/0276743 | A1 | * | 11/2010 | Kuniya et al. ................. 257/315 |
| 2011/0147824 | A1 | * | 6/2011 | Son et al. ...................... 257/324 |

FOREIGN PATENT DOCUMENTS

JP    2007-266143    10/2007

OTHER PUBLICATIONS

Riley et al., Comparison of etch rates of silicon nitride, silicon dioxide, and polycrystalline silicon upon O2 dilution of CF4 plasmas; Journal of Vacuum Science & Technology B vol. 7 Issue 6; Nov./Dec. 1989, pp. 1352-1356.*

(Continued)

*Primary Examiner* — N Drew Richards
*Assistant Examiner* — John P Dulka
(74) *Attorney, Agent, or Firm* — Oblon, Spivak, McClelland, Maier & Neustadt, L.L.P.

(57) ABSTRACT

In a nonvolatile semiconductor memory device, a stacked body is provided on a silicon substrate by alternately stacking pluralities of isolation dielectric films and electrode films, a through-hole is formed in the stacked body to extend in the stacking direction, a memory film is formed by stacking a block layer, a charge layer and a tunnel layer in this order at an inner face of the through-hole, and thereby a silicon pillar is buried in the through-hole. At this time, the electrode film is protruded further than the isolation dielectric film toward the silicon pillar at the inner face of the through-hole, and an end face of the isolation dielectric film has a curved shape displacing toward the silicon pillar side as the electrode film is approached.

8 Claims, 11 Drawing Sheets

OTHER PUBLICATIONS

Kataoka et al., Dry etching characteristics of Si-based materials using CF4/O2 atmospheric-pressure glow discharge plasma; Japanese Journal of Applied Physics vol. 39; year 2000, pp. 294-298.*

U.S. Appl. No. 13/008,469, filed Jan. 18, 2011, Sekine et al.
U.S. Appl. No. 12/405,474, filed Mar. 17, 2009, Yoshio Ozawa et al.
U.S. Appl. No. 13/234,406, filed Sep. 16, 2011, Sekine, et al.

* cited by examiner

NONVOLATILE SEMICONDUCTOR MEMORY DEVICE WITH ALTERNATELY STACKED ISOLATION DIELECTRIC FILMS AND ELECTRODE FILMS

CROSS-REFERENCE TO RELATED APPLICATIONS

This application is based upon and claims the benefit of priority from the prior Japanese Patent Application No. 2008-231904, filed on Sep. 10, 2008; the entire contents of which are incorporated herein by reference.

BACKGROUND OF THE INVENTION

1. Field of the Invention

The invention relates to a nonvolatile semiconductor memory device and a method for manufacturing the same including a plurality of isolation dielectric films and a plurality of electrode films alternately stacked on a substrate.

2. Background Art

Flash memory conventionally is constructed by two-dimensionally integrating elements on a surface of a silicon substrate. In such flash memory, the dimensions of each element must be reduced for downscaling to increase the memory capacity. However, such downscaling in recent years has become difficult in regard to both cost and technology.

To solve such problems, a collectively-patterned three-dimensional stacked memory has been proposed (for example, refer to JP-A 2007-266143 (Kokai)). In such technology, a stacked body is formed on a silicon substrate by alternately stacking an electrode film and an isolation dielectric film, and then forming through-holes in the stacked body by collective patterning. A charge storage layer is formed on a side face of each through-hole, and silicon is filled into an interior of the through-hole to form a silicon pillar. A cell transistor is thereby formed at an intersection between each electrode film and each silicon pillar. In such a collectively-patterned three-dimensional stacked memory, a charge can be removed from and put into the charge storage layer from the silicon pillar to record information in the cell transistor by controlling an electrical potential of each electrode film and each silicon pillar. According to such technology, the cell transistors can be three-dimensionally integrated, and the memory capacity can be increased. Moreover, the three-dimensional stacked memory can be formed by collectively patterning the stacked body. Therefore, the number of lithography processes does not increase, and the cost can be prevented from increasing even in the case where the number of stacks increases.

However, it is unfortunately difficult to provide both sufficient ON/OFF characteristics of the cell transistor and endurance to stress during writing/erasing in such a collectively-patterned three-dimensional stacked memory.

SUMMARY OF THE INVENTION

According to an aspect of the invention, there is provided a nonvolatile semiconductor memory device, including: a substrate; a stacked body provided on the substrate and including alternately stacked pluralities of isolation dielectric films and electrode films, a through-hole being formed in the stacked body to extend in the stacking direction; a semiconductor pillar buried in the through-hole; and a charge storage layer provided between the electrode films and the semiconductor pillar, the electrode film protruding further than the isolation dielectric film toward the semiconductor pillar at an inner face of the through-hole, an end face of the isolation dielectric film having a curved shape displacing toward the semiconductor pillar side as the electrode film is approached.

According to another aspect of the invention, there is provided a nonvolatile semiconductor memory device, including: a substrate; a stacked body provided on the substrate and including alternately stacked pluralities of isolation dielectric films and electrode films, a through-hole being formed in the stacked body to extend in the stacking direction; a semiconductor pillar buried in the through-hole; and a charge storage layer provided between the electrode films and the semiconductor pillar, the electrode film protruding further than the isolation dielectric film toward the semiconductor pillar at an inner face of the through-hole, a corner of the electrode film being rounded.

According to still another aspect of the invention, there is provided a nonvolatile semiconductor memory device, including: a substrate; a stacked body provided on the substrate and including alternately stacked pluralities of isolation dielectric films and electrode films, a through-hole being formed in the stacked body to extend in the stacking direction; a semiconductor pillar buried in an interior of the through-hole; and a charge storage layer provided between the electrode films and the semiconductor pillar, the electrode film protruding further than the isolation dielectric film toward the semiconductor pillar at an inner face of the through-hole, an end face of a portion of the isolation dielectric film contacting the electrode film being disposed at a position more distal than end faces of other portions of the isolation dielectric film as viewed from the semiconductor pillar.

According to still another aspect of the invention, there is provided a method for manufacturing a nonvolatile semiconductor memory device, including: alternately stacking a plurality of isolation dielectric films and a plurality of electrode films on a substrate to form a stacked body; forming a through-hole in the stacked body to extend in the stacking direction; etching an inner face of the through-hole; forming a charge storage layer on the inner face of the through-hole; and burying a semiconductor pillar in an interior of the through-hole, the stacking of the isolation dielectric films including: forming a first high density film; forming a low density film on the first high density film, the low density film being less dense than the first high density film; and forming a second high density film on the low density film, the second high density film being denser than the low density film.

According to still another aspect of the invention, there is provided a method for manufacturing a nonvolatile semiconductor memory device, including: alternately stacking a plurality of isolation dielectric films and a plurality of electrode films on a substrate to form a stacked body; forming a through-hole in the stacked body to extend in the stacking direction; etching an inner face of the through-hole; forming a charge storage layer on the inner face of the through-hole; and burying a semiconductor pillar in an interior of the through-hole, the stacking of the isolation dielectric films including: forming a first low density film; forming a high density film on the first low density film, the high density film being denser than the first low density film; and forming a second low density film on the high density film, the second low density film being less dense than the high density film.

DETAILED DESCRIPTION OF THE INVENTION

Embodiments of the invention will now be described with reference to the drawings.

First, a first embodiment of the invention will be described.

Figure 1:
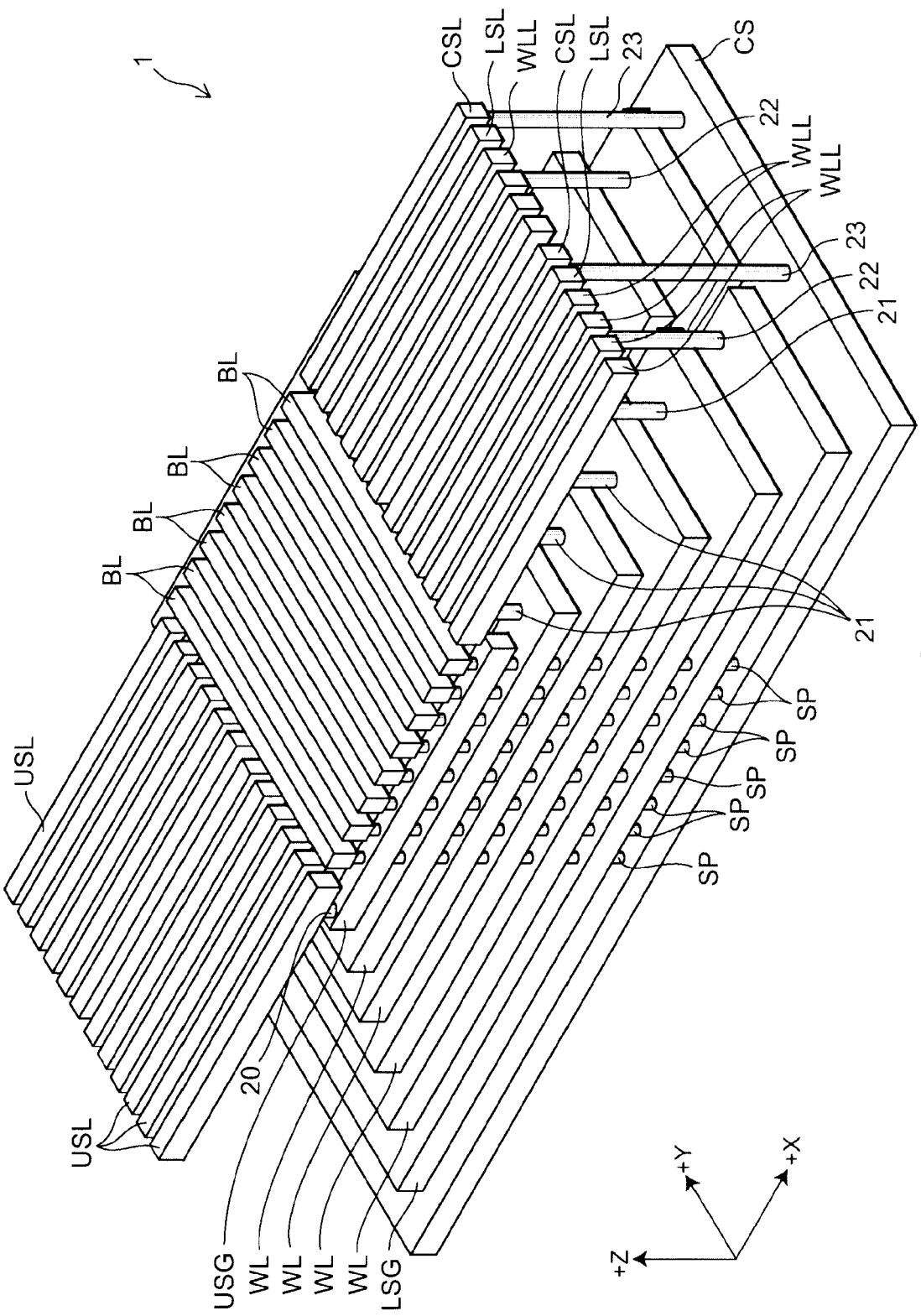
FIG. 1 is a perspective view illustrating a nonvolatile semiconductor memory device according to a first embodiment of the invention.

FIG. 1 is a perspective view illustrating a nonvolatile semiconductor memory device according to this embodiment.

Figure 2:
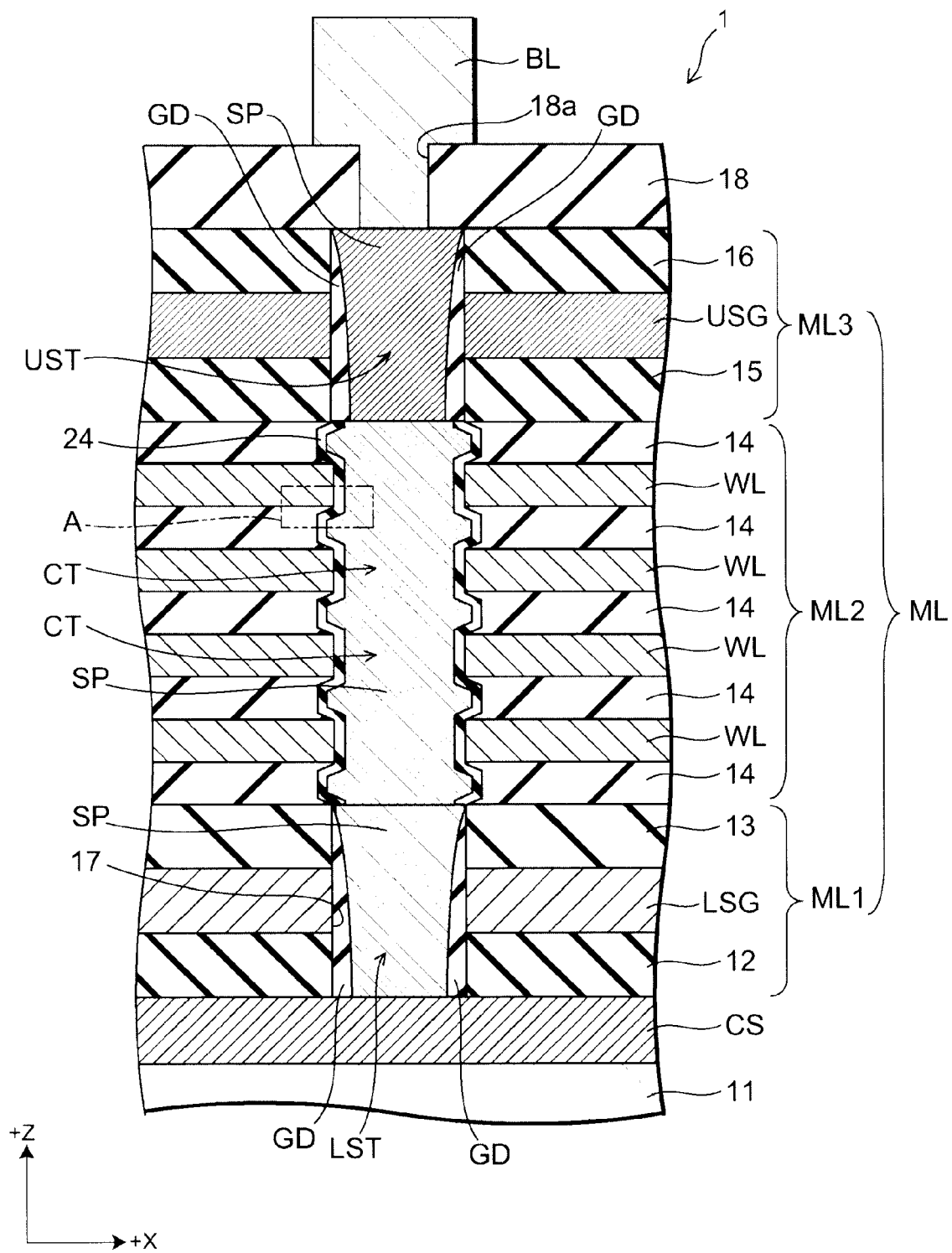
FIG. 2 is a cross-sectional view illustrating the nonvolatile semiconductor memory device according to the first embodiment.

FIG. 2 is a cross-sectional view illustrating the nonvolatile semiconductor memory device according to this embodiment.

Figure 3:
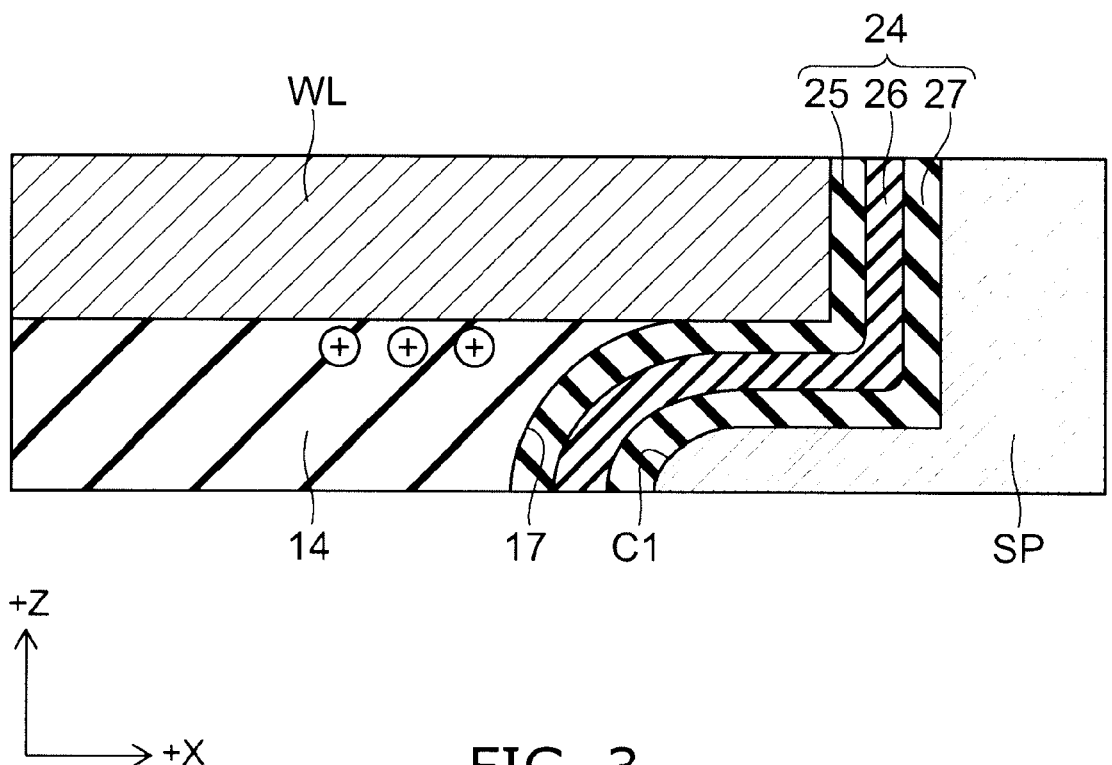
FIG. 3 is a partially enlarged cross-sectional view illustrating the portion A of FIG. 2.

FIG. 3 is a partially enlarged cross-sectional view illustrating the portion A of FIG. 2.

Figure 4:
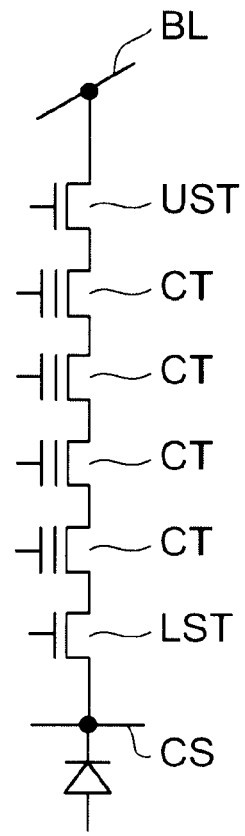
FIG. 4 is a schematic circuit diagram illustrating a function of one memory string.

FIG. 4 is a schematic circuit diagram illustrating a function of one memory string.

Only conductive portions are illustrated in FIG. 1 for better clarity, and insulative portions are omitted. Portions of a silicon substrate 11 (referring FIG. 2) also are omitted except for a cell source CS.

A feature of the nonvolatile semiconductor memory device according to this embodiment is that the electrode film of each memory cell protrudes further than isolation dielectric films toward a silicon pillar side, and each component is configured to reduce electric field concentration.

First, the overall configuration of the nonvolatile semiconductor memory device will be described to clarify the positional relationship and the functions of the electrode film, the isolation dielectric film, and the silicon pillar of the nonvolatile semiconductor memory device.

In a nonvolatile semiconductor memory device 1 (hereinbelow also referred to as simply "device 1") according to this embodiment illustrated in FIG. 1 and FIG. 2, a silicon substrate 11 made of, for example, epitaxial silicon is provided. A cell source CS is formed of a semiconductor region formed by introducing an impurity into a rectangular memory array region of an upper layer portion of the silicon substrate 11. The cell source CS is, for example, an $n^+$-type diffusion layer.

An insulating film 12 made of, for example, silicon oxide ($SiO_2$) is provided in a region directly above the cell source CS on the silicon substrate 11. A lower selection gate LSG made of, for example, n-type polycrystalline silicon is provided thereupon. An insulating film 13 made of, for example, silicon oxide is provided thereupon. The insulating film 12, the lower selection gate LSG, and the insulating film 13 form a stacked body ML1.

A stacked body ML2 is formed above the stacked body ML1 by alternately stacking a plurality of isolation dielectric films 14 (referring to FIG. 2) made of, for example, silicon oxide and a plurality of electrode films WL made of, for example, polycrystalline silicon. The electrode films WL function as word lines of the device 1. The isolation dielectric films 14 are provided above, below, and between the electrode films WL and function as inter-layer dielectric films that insulate the electrode films WL from each other. For reasons described below, the isolation dielectric film 14 made of silicon oxide contains at least one of carbon and nitrogen as an unavoidable impurity.

An insulating film 15 made of, for example, silicon oxide is provided on the stacked body ML2. Upper selection gates USG made of, for example, polycrystalline silicon are provided thereupon. An insulating film 16 made of, for example, silicon oxide is provided thereupon. The insulating film 15, the upper selection gates USG, and the insulating film 16 form a stacked body ML3.

An XYZ orthogonal coordinate system is introduced in the specification for convenience of description hereinbelow. In this coordinate system, an X direction and a Y direction are assumed to be two mutually orthogonal directions parallel to an upper face of the silicon substrate 11. A Z direction is assumed to be a direction orthogonal to both the X direction and the Y direction, that is, the stacking direction of the isolation dielectric films 14 and the electrode films WL.

The X-direction lengths of the electrode films WL are shorter as the electrode film WL is disposed in a higher layer. As viewed from above (the positive Z direction), each of the electrode films WL is disposed inside the electrode films WL, the lower selection gate LSG, and the cell source CS disposed therebelow. The upper selection gates USG are disposed inside the uppermost electrode film WL. Thereby, the end portions of a stacked body ML have a stairstep configuration. As viewed from the stacked body ML, an inter-layer dielectric film (not illustrated) is provided in regions in the ±X directions and the ±Y directions.

Thus, the stacked body ML1, the stacked body ML2, and the stacked body ML3 are stacked in order on the silicon substrate 11. Accordingly, the lower selection gate LSG is provided between the silicon substrate 11 and the stacked body ML2, and the upper selection gates USG are provided above the stacked body ML2. A plurality of sets of the stacked body ML1, the stacked body ML2, and the stacked body ML3 (hereinbelow also generally referred to as "stacked body ML") are provided along the Y direction.

The upper selection gates USG are a plurality of interconnection-shaped conductive members extending in the X direction and formed by dividing one conducting film made of, for example, amorphous silicon along the Y direction. Conversely, the electrode films WL and the lower selection gate LSG are not divided inside each stacked body ML, and each forms one conducting film parallel to the XY plane. The cell source CS also is not divided and forms one layer-shaped conducting region parallel to the XY plane to connect a region directly below a plurality of stacked bodies ML.

A plurality of through-holes 17 are formed in the stacked body ML to extend in the stacking direction (the Z direction). Each of the through-holes 17 passes completely through the entire stacked body ML. In other words, the through-hole 17 passes completely through, at the same position as viewed from the Z direction, each of the insulating film 12, the lower selection gate LSG, and the insulating film 13 forming the stacked body ML1; the isolation dielectric films 14 and the electrode films WL forming the stacked body ML2; and the insulating film 15, the upper selection gate USG, and the insulating film 16 forming the stacked body ML3. The through-holes 17 are arranged in a matrix configuration along, for example, the X direction and the Y direction.

A silicon pillar SP is buried in an interior of each through-hole 17. The silicon pillar SP is formed of a semiconductor, e.g., polycrystalline silicon doped with an impurity. The silicon pillar SP has a columnar configuration, e.g., a substantially circular columnar configuration, extending in the Z direction. The silicon pillar SP is provided over the entire stacking-direction length of the stacked body ML. A lower end portion of the silicon pillar SP connects to the cell source CS.

An insulating film 18 is provided on the stacked body ML3. A plurality of bit interconnections BL are provided on the insulating film 18 to extend in the Y direction. The bit interconnection BL is formed of metal. Each bit interconnection is disposed to pass through a region directly above each series of silicon pillars SP arranged along the Y direction. Each bit interconnection BL connects to upper end portions of the silicon pillars SP through via holes 18a made in the insulating film 18. Thereby, each series of silicon pillars SP provided along the Y direction connects to a different bit interconnection BL. In other words, each silicon pillar SP is connected between the bit interconnection BL and the cell source CS.

A plurality of upper selection gate interconnections USL are provided to extend in the X direction on the negative X direction side of a region in which the bit interconnections BL are disposed. The upper selection gate interconnections USL are formed of metal. The number of upper selection gate interconnections USL is the same as the number of upper selection gates USG. Each upper selection gate interconnection USL connects to the respective upper selection gate USG through a via 20.

On the positive X direction side of the region in which the bit interconnections BL are disposed, for each stacked body ML, there is provided a plurality of word interconnections WLL extending in the X direction, one lower selection gate interconnection LSL extending in the X direction, and one cell source interconnection CSL extending in the X direction. The word interconnections WLL, the lower selection gate interconnection LSL, and the cell source interconnection CSL are formed of metal. The number of word interconnections WLL corresponding to one stacked body ML is the same as the number of electrode films WL, i.e., word lines. Each word interconnection WLL connects to the respective electrode film WL through a via 21. The lower selection gate interconnection LSL connects to the lower selection gate LSG through a via 22. The cell source interconnection CSL connects to the cell source CS via a contact 23. Each of the vias 21 and 22 and the contact 23 is provided in a region which is directly above the electrode film WL with which it communicates and outside on the positive X direction side of the electrode films WL provided thereabove as viewed from the electrode films WL.

The bit interconnections BL, the upper selection gate interconnections USL, the word interconnections WLL, the lower selection gate interconnection LSL, and the cell source interconnection CSL are formed of the same material, have substantially the same thickness and position in the Z direction, and are formed by, for example, patterning one metal film. An inter-layer dielectric film (not illustrated) insulates between each interconnection.

As illustrated in FIG. 2 and FIG. 3, a memory film 24 is provided in a cylindrical space between a portion of the silicon pillar SP positioned in the stacked body ML2 (hereinbelow also referred to as "central portion of the silicon pillar") and a side face of the through-hole 17. The memory film 24 includes a block layer 25, a charge layer 26, and a tunneling layer 27 stacked in order from the outside, that is, the electrode film WL side. The block layer 25 contacts the isolation dielectric films 14 and the electrode films WL. The tunneling layer 27 contacts the silicon pillar SP.

The block layer 25 is made of, for example, silicon oxide ($SiO_2$), alumina ($Al_2O_3$), or a stacked two-layer film of an alumina ($Al_2O_3$) layer and a silicon nitride ($Si_3N_4$) layer. The charge layer 26 is made of, for example, silicon nitride ($Si_3N_4$). The tunneling layer 27 is made of, for example, silicon oxide ($SiO_2$). In other words, the block layer 25/charge layer 26/tunneling layer 27 composition is $SiO_2/Si_3N_4/SiO_2$, $Al_2O_3/Si_3N_4/SiO_2$, or $Si_3N_4/Al_2O_3/Si_3N_4/SiO_2$.

Thereby, the central portion of the silicon pillar SP functions as a channel, and the electrode film WL functions as a control gate. A cell transistor CT is thereby formed at the intersection between the silicon pillar SP and the electrode film WL. The charge layer 26 functions as a charge storage layer, and information can be stored by whether or not a charge is stored in the charge layer 26. Thereby, the cell transistor CT functions as a memory cell.

On the other hand, gate insulation films GD are provided in the cylindrical space between portions of the silicon pillar SP positioned in interiors of the stacked bodies ML1 and ML3 and the side face of the through-hole 17. Thereby, a lower selection transistor LST including the lower portion of the silicon pillar SP as a channel and the lower selection gate LSG as a gate is formed in the stacked body ML1. Also, an upper selection transistor UST including the upper portion of the silicon pillar SP as a channel and the upper selection gate USG as a gate is formed in the stacked body ML3. The lower selection transistor LST and the upper selection transistor UST do not function as memory cells, but perform the role of selecting the silicon pillar SP.

As a result, as illustrated in FIG. 4, the same number of cell transistors CT as electrode films WL is arranged in series in the Z direction on and around one silicon pillar SP to form one memory string. The memory string is connected between the bit interconnection BL and the cell source CS. The upper selection transistor UST is provided on the upper end of the memory string. The lower selection transistor LST is provided on the lower end of the memory string. In the device 1, a plurality of silicon pillars SP are arranged in a matrix configuration along the X direction and the Y direction. Thereby, a plurality of memory cells are three dimensionally arranged along the X direction, the Y direction, and the Z direction.

Characteristic portions of this embodiment will now be described.

In this embodiment illustrated in FIG. 2 and FIG. 3, the electrode films WL protrude further than the isolation dielectric films 14 toward the silicon pillar SP at the inner face of the through-hole 17. The end face of each isolation dielectric film 14 on the silicon pillar SP side has a curved shape displacing toward the silicon pillar SP side as the electrode film WL is approached. In other words, each region of the inner face of the through-hole 17 defined by the isolation dielectric film 14 is curved in a recessed configuration as viewed from the interior of the through-hole 17. A portion at the Z-direction center of this region is positioned further toward the outside of the through-hole 17 than both portions at the Z-direction ends. An outer face of the silicon pillar SP is configured along the inner face of the through-hole 17. The portion of the silicon pillar SP enclosed by the isolation dielectric film 14 juts further toward the outside than the portion enclosed by the electrode film WL. The jutting portion is curved in a protruding configuration along the curve of the recessed configuration of the end face of the isolation dielectric film 14. Accordingly, a corner C1 of the jutting portion of the silicon pillar SP is gently rounded.

A method for manufacturing a nonvolatile semiconductor memory device according to this embodiment will now be described.

Figure 5:
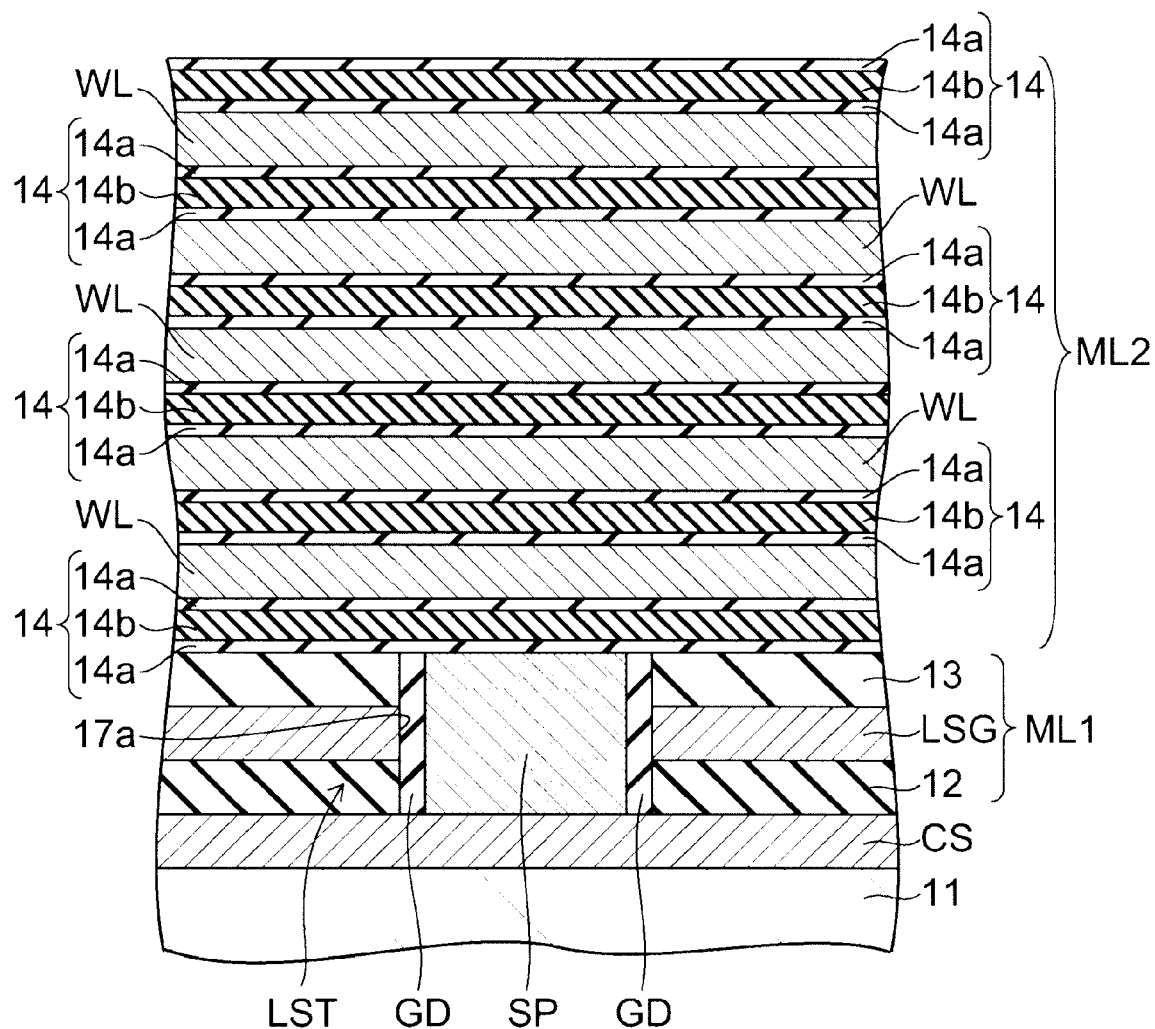
FIG. 5 to FIG. 7 are process cross-sectional views illustrating a method for manufacturing the nonvolatile semiconductor memory device according to the first embodiment.
Figure 6:
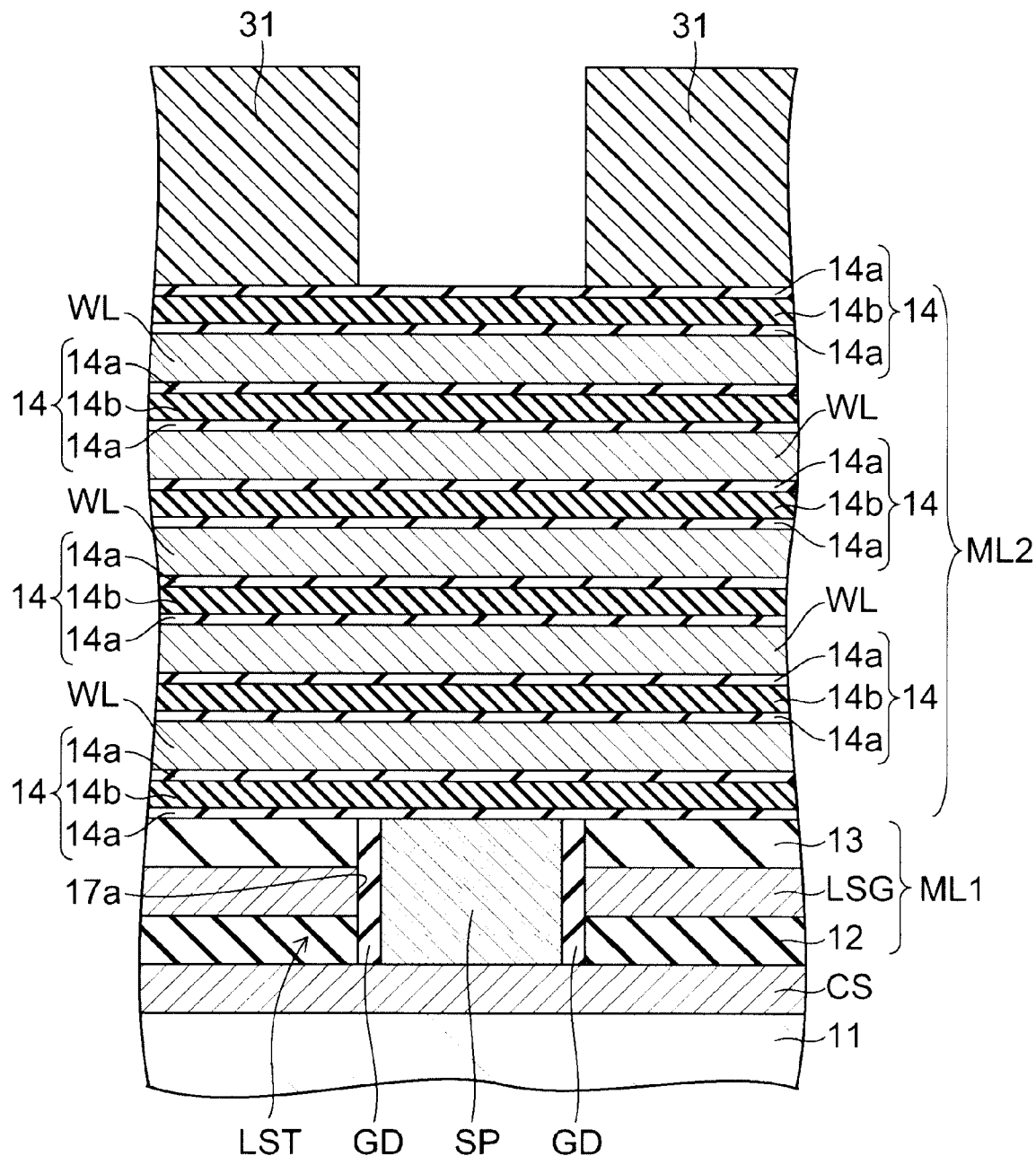
Figure 7:
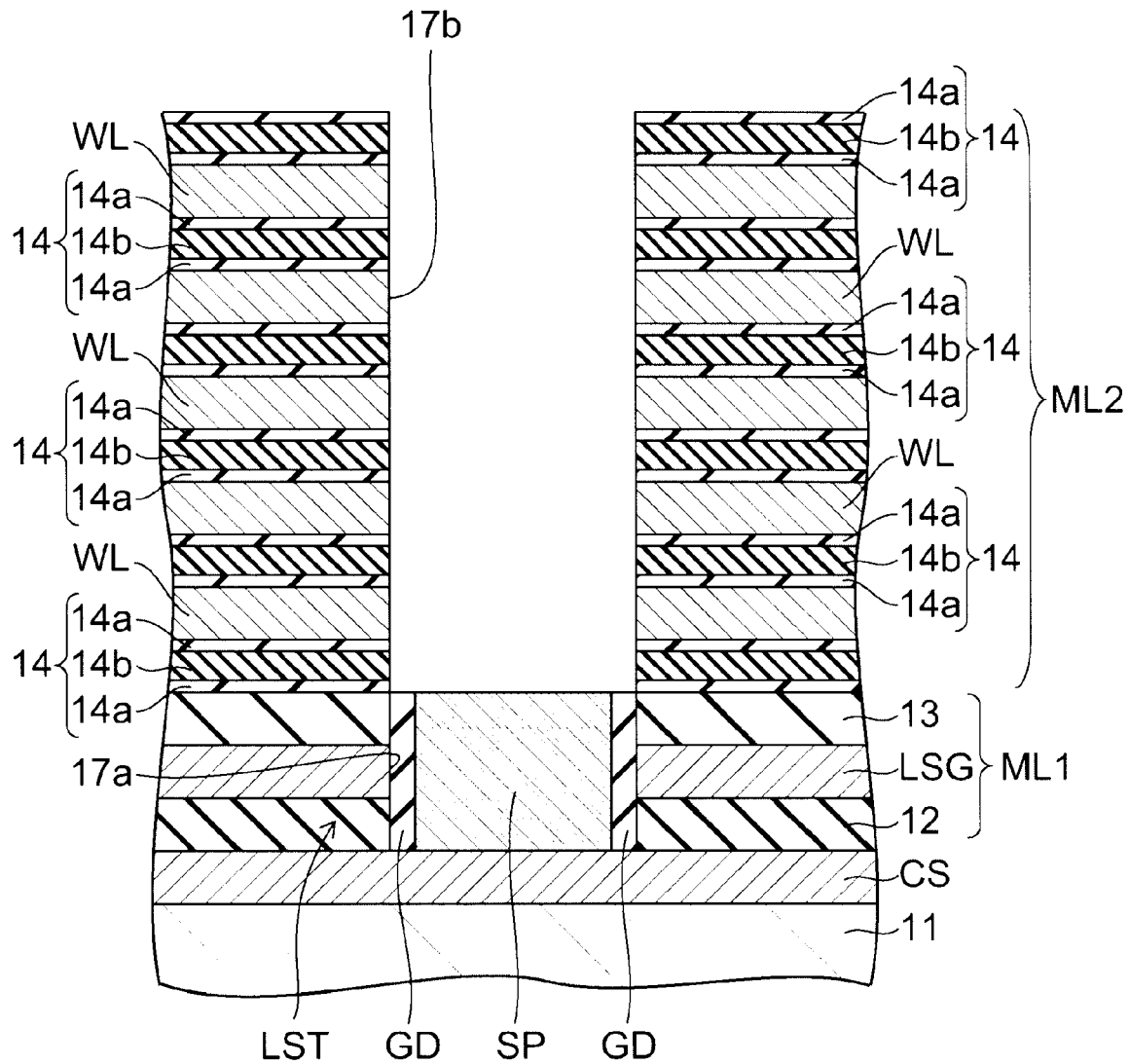

FIG. 5 to FIG. 7 are process cross-sectional views illustrating the method for manufacturing the nonvolatile semiconductor memory device according to this embodiment.

Figure 8A:
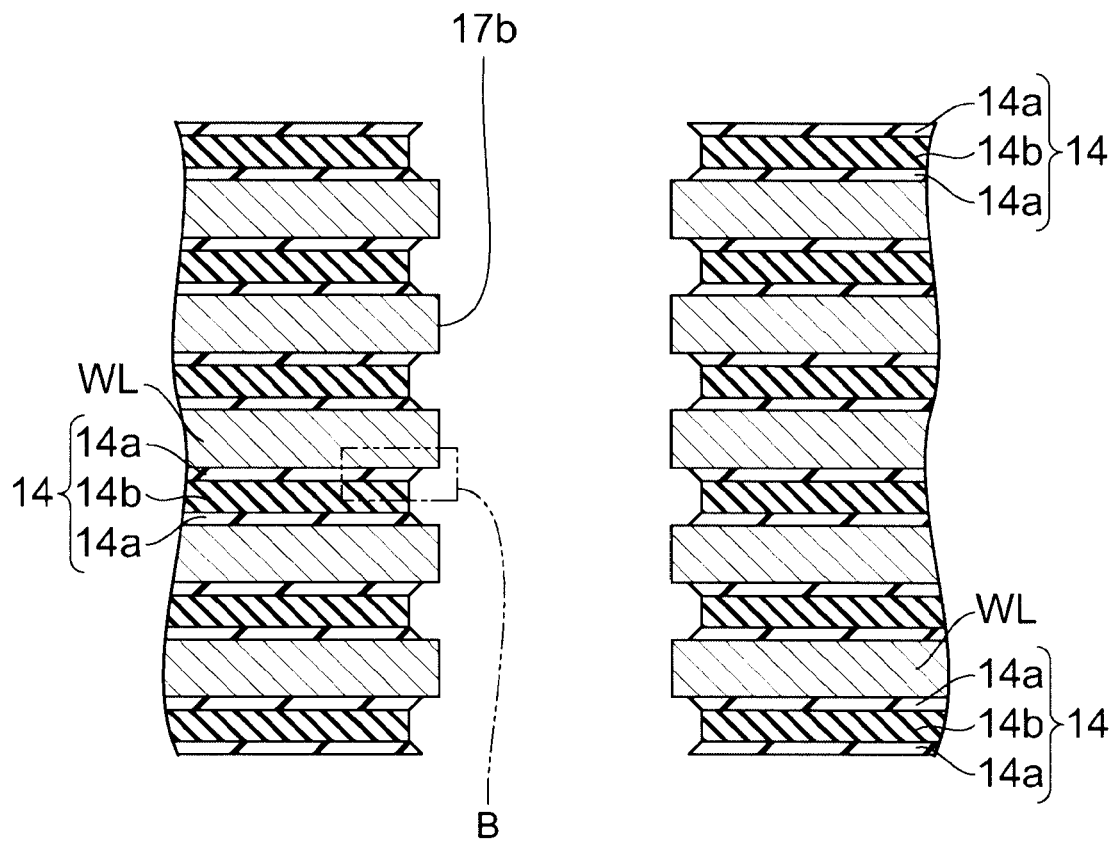
FIG. 8A is a process cross-sectional view illustrating the method for manufacturing the nonvolatile semiconductor memory device according to the first embodiment.
Figure 8B:
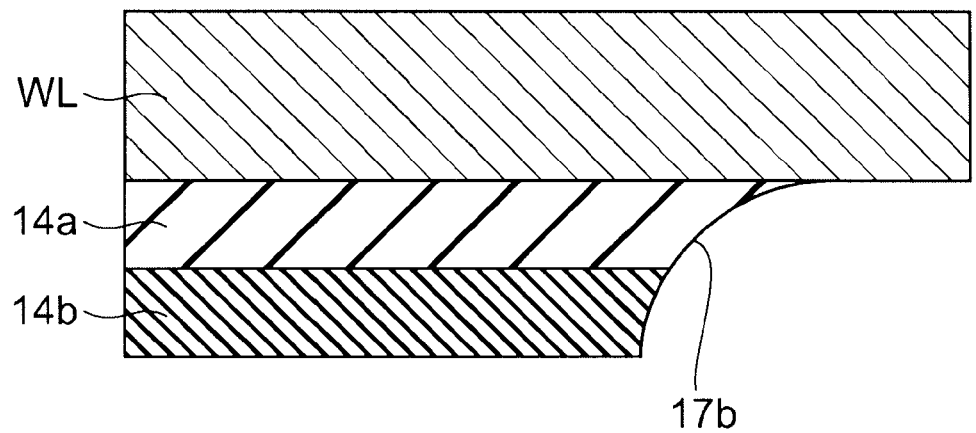
FIG. 8B is a partially enlarged cross-sectional view illustrating the portion B of FIG. 8A.
Figure 8B:
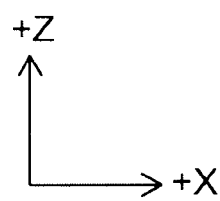

FIG. 8A is a process cross-sectional view illustrating the method for manufacturing the nonvolatile semiconductor memory device according to this embodiment. FIG. 8B is a partially enlarged cross-sectional view illustrating the portion B of FIG. 8A.

A feature of the method for manufacturing the nonvolatile semiconductor memory device according to this embodiment is that the end face of each of the isolation dielectric films 14 which defines the inner face of the through-hole is curved by forming the isolation dielectric film 14 of three stacked layers having mutually different etching rates and by etching the isolation dielectric films 14 via the through-hole. The details are described below.

First, as illustrated in FIG. 5, ion implantation is performed in the memory array region of the silicon substrate 11 to form the cell source CS made of an n$^+$-type diffusion layer. Then, the insulating film 12 is formed on the silicon substrate 11 by depositing silicon oxide by LPCVD (Low Pressure Chemical Vapor Deposition) at a temperature of 650 to 750° C. using DCS (Dichlorosilane: $SiCl_2H_2$) and $N_2O$ (nitrous oxide) as source gases. The lower selection gate LSG made of a conducting film is then formed by depositing n-type polycrystalline silicon by LPCVD at a temperature of 550 to 650° C. using $SiH_4$ and $PH_3$ as source gases. Then, the insulating film 13 made of an inter-layer film is formed by depositing silicon oxide by LPCVD at a temperature of 650 to 750° C. using DCS and $N_2O$ as source gases. Thereby, the stacked body ML1 made of the insulating film 12, the lower selection gate LSG, and the insulating film 13 is formed.

Continuing, a through-hole 17a is formed in the stacked body ML1 by lithography and etching to extend in the Z direction (the stacking direction) and reach the cell source CS of the silicon substrate 11. At this time, a plurality of through-holes 17a are formed simultaneously in a matrix configuration as viewed from the Z direction.

A silicon nitride film is then formed on the entire surface of the stacked body M1. In addition to the upper face of the stacked body M1, the silicon nitride film is formed on a bottom face and a side face of the through-hole 17a. Then, the silicon nitride film formed on the upper face of the stacked body ML1 and the bottom face of the through-hole 17a is removed by performing, for example, RIE (Reactive Ion Etching). The silicon nitride film thereby remains on the side face of the through-hole 17a to form a gate insulation film GD. Amorphous silicon is filled into the interior of the through-hole 17a. Thereby, the lower portion of the silicon pillar SP is formed in the through-hole 17a, and the lower selection transistor LST is formed.

Then, the isolation dielectric films 14 and the electrode films WL are alternately stacked on the stacked body ML1 to form the stacked body ML2. For example, six layers of the isolation dielectric film 14 made of silicon oxide and five layers of the electrode film WL made of n-type polycrystalline silicon are formed alternately.

At this time, each of the isolation dielectric films 14 is formed of a relatively dense silicon oxide film (hereinbelow referred to as "high density film 14a") and a silicon oxide film of relatively low density (hereinbelow referred to as "low density film 14b") stacked in three layers in the order of a high density film 14a, a low density film 14b, and a high density film 14a. In one example, the high density film 14a is formed by LPCVD at a temperature of 650 to 750° C. using DCS and $N_2O$ as source gases. The low density film 14b is formed by ALD (Atomic Layer Deposition) at a temperature of 450 to 550° C. using DCS and $N_2O$ as source gases. On the other hand, the electrode film WL is formed by LPCVD at a temperature of 550 to 650° C. using $SiH_4$ and $PH_3$ as source gases.

Then, a photoresist film (not illustrated) is formed on the stacked body ML2 and patterned into a rectangular configuration. The end portions of the stacked body ML2 are then patterned into a stairstep configuration by alternately repeating performing RIE using the photoresist film as a mask to pattern one layer of each of the isolation dielectric films 14 and electrode films WL and performing ashing of the photoresist film to make the profile of the photoresist film smaller (slimming) each time.

Continuing as illustrated in FIG. 6, a photoresist is patterned by coating, exposing, and developing to form a photoresist film 31. Then, as illustrated in FIG. 7, a through-hole 17b is formed in the stacked body ML2 to extend in the Z direction and reach the stacked body ML1 by collectively patterning the stacked isolation dielectric films 14 and electrode films WL by RIE using the photoresist film 31 as a mask. At this time, the through-hole 17b is formed in a region directly above the through-hole 17a to communicate with the through-hole 17a. Subsequently, wet processing is performed to remove patterning residue.

Then, as illustrated in FIGS. 8A and 8B, dilute hydrofluoric acid treatment is performed on the inner face of the through-hole 17b. Although the end face of each of the isolation dielectric films 14 facing the interior of the through-hole 17b is thereby etched, at this time, the etching rate of the low density film 14b is higher than the etching rate of the high density films 14a. Therefore, the low density film 14b forming the middle layer of each of the isolation dielectric films 14 is etched deeper than the high density films 14a forming the upper layer and the lower layer of each of the isolation dielectric films 14. A face of each high density film 14a contacting the low density film 14b is exposed to the dilute hydrofluoric acid as the low density film 14b is etched away. Etching advances from this face as well. As a result, each of the regions of the inner face of the through-hole 17b defined by the isolation dielectric film 14 is curved in a recessed configuration as viewed from the interior of the through-hole 17b.

As illustrated in FIG. 3, the memory film 24 is then formed on the entire surface by performing film formation of the block layer 25, the charge layer 26, and the tunneling layer 27 in order. In addition to the upper face of the stacked body ML2, the memory film 24 is formed also on the bottom face and the side face of the through-hole 17b.

As described above, the block layer 25/charge layer 26/tunneling layer 27 composition is $SiO_2/Si_3N_4/SiO_2$, Al$_2$O$_3$/Si$_3$N$_4$/SiO$_2$, or Si$_3$N$_4$/Al$_2$O$_3$/Si$_3$N$_4$/SiO$_2$. In the case where a silicon oxide layer (SiO$_2$) is formed as the block layer 25, ALD is used with TDMAS (Trisdimethylaminosilane: SiH(N(CH$_3$)$_2$)$_3$) and O$_3$ as source gases. In the case where an alumina layer (Al$_2$O$_3$) is formed as the block layer 25, ALD is used with TMA (Trimethylaluminium: (CH$_3$)$_3$Al) and H$_2$O as source gases. In the case where a silicon nitride layer (Si$_3$N$_4$) is formed as the block layer 25, ALD is used with DCS and NH$_3$ as source gases. Also in the case where a silicon nitride layer (Si$_3$N$_4$) is formed as the charge layer 26, ALD is used with DCS and NH$_3$ as source gases. In the case where a silicon oxide layer (SiO$_2$) is formed as the tunneling layer 27, ALD is used with TDMAS and O$_3$ as source gases.

Then, an amorphous silicon film is formed as a protective film (not illustrated) by LPCVD at a temperature of 550 to 600° C. using SiH$_4$ as a source gas. Subsequently, RIE is performed to remove the memory film 24 from the upper face of the stacked body ML2 and the bottom face of the through-hole 17b. Thereby, the memory film 24 including the charge layer 26 is formed only on the side face of the through-hole 17b. Then, cleaning is performed.

Continuing, amorphous silicon is once again filled into the through-hole 17b by LPCVD at a temperature of 550 to 600° C. using SiH$_4$ as a source gas. At this time, the amorphous silicon contacts the lower portion of the silicon pillar SP. Subsequently, activation annealing is performed to crystallize the amorphous silicon, forming the central portion of the silicon pillar SP made of polycrystalline silicon to form the channel of the memory cell. At this time, the outer face of the central portion of the silicon pillar SP is curved along the inner face of the through-hole 17b. Therefore, the corner C1 of the jutting portion of the silicon pillar SP is gently rounded.

Then, the insulating film 15 is formed on the stacked body ML2 by depositing silicon oxide by LPCVD at a temperature of 650 to 750° C. using DCS and N$_2$O as source gases. The upper selection gate USG made of a conducting film is then formed by depositing n-type polycrystalline silicon by LPCVD at a temperature of 550 to 650° C. using SiH$_4$ and PH$_3$ as source gases. Then, the insulating film 16 is formed by depositing silicon oxide by LPCVD at a temperature of 650 to 750° C. using DCS and N$_2$O as source gases. Thereby, the stacked body ML3 made of the insulating film 15, the upper selection gate USG, and the insulating film 16 is formed.

A through-hole is formed in the stacked body ML3 by lithography and etching in a region directly above the through-hole 17b to extend in the Z direction and reach the stacked body ML2. This through-hole communicates with the through-hole 17b. In other words, the through-holes formed in each of the stacked bodies ML1 to ML3 mutually communicate to form a continuous through-hole 17 in the Z direction.

Then, the upper selection transistor UST is formed by forming the gate insulation film GD made of silicon nitride on the side face of the through-hole in the stacked body ML3 and forming the upper portion of the silicon pillar SP in the through-hole by a method similar to the method for constructing the lower selection transistor LST described above. Thereby, the lower portion, the central portion, and the upper portion of the silicon pillar SP are integrally linked to form the silicon pillar SP extending in the Z direction. The insulating film 18 is then formed on the stacked body ML3.

Continuing as illustrated in FIG. 1, the vias 20, 21, and 22 and the contact 23 are provided in the insulating film 18 (referring to FIG. 2). Then, a metal film is formed on the entire surface and patterned to form the bit interconnections BL, the upper selection gate interconnections USL, the word interconnections WLL, the lower selection gate interconnection LSL, and the cell source interconnection CSL. Thereby, the nonvolatile semiconductor memory device 1 is manufactured.

Effects of this embodiment will now be described.

In the nonvolatile semiconductor memory device 1 according to this embodiment, the X coordinate of the memory cell is selected by selecting the bit interconnection BL; the Y coordinate of the memory cell is selected by selecting the upper selection gate USG to switch the upper selection transistor UST to a conducting state or a nonconducting state; and the Z coordinate of the memory cell is selected by selecting the electrode film WL as the word line. Information is stored by implanting electrons into the charge layer 26 of the selected memory cell. The information stored in the memory cell is read by providing a sense current to the silicon pillar SP passing through the memory cell.

Although the isolation dielectric film 14, i.e., the inter-layer film of the memory cell, is formed of silicon oxide (SiO$_2$) as described above, traps are formed by nitrogen (N) or carbon (C) in the case where nitrogen or carbon mixes into the silicon oxide, and a positive fixed charge is undesirably stored. Thereby, the electrode film WL, i.e., the control gate, has a weak controllability over the silicon pillar SP, i.e., the channel; the ON current cannot be increased sufficiently; and the OFF current cannot be cut off sufficiently. In other words, the ON/OFF characteristics of the cell transistor CT undesirably decline. Moreover, a potential cannot be actively applied to the isolation dielectric film 14. Therefore, it is difficult to control the accumulation of the fixed charge in such traps.

In regard to routes by which nitrogen or carbon mix into the isolation dielectric film 14, mixing may occur from the film formation material of the isolation dielectric film 14 itself, or mixing may occur from the film formation material of the block layer 25 of the memory film 24. Mixing from the film formation material of the isolation dielectric film 14 includes the case where the silicon oxide forming the isolation dielectric film 14 is deposited using TEOS (Tetra-Ethoxy-Silane: Si(OC$_2$H$_5$)$_4$) as a source gas. In such a case, the carbon (C) in the TEOS mixes into the isolation dielectric film 14. In addition to TEOS, similar mixing occurs in the case where the isolation dielectric film 14 is formed using a precursor including carbon or nitrogen.

On the other hand, mixing from the film formation material of the block layer 25 occurs in cases such as the following. Namely, in the case where a silicon oxide layer (SiO$_2$) is formed as the block layer 25, TDMAS (SiH(N(CH$_3$)$_2$)$_3$) is used as a source gas, and therefore nitrogen (N) and carbon (C) in the TDMAS enter into the isolation dielectric film 14 directly from the source gas or due to solid state diffusion from the block layer 25 formed as a film. In the case where an alumina layer (Al$_2$O$_3$) is formed as the block layer 25, TMA ((CH$_3$)$_3$Al) is used as a source gas, and therefore carbon (C) in the TMA enters into the isolation dielectric film 14 directly from the source gas or due to solid state diffusion from the block layer 25. In the case where a silicon nitride layer (Si$_3$N$_4$) is formed as the block layer 25, NH$_3$ is used as a source gas, and therefore nitrogen (N) in the NH$_3$ enters into the isolation dielectric film 14 directly from the source gas or due to solid state diffusion from the block layer 25.

Therefore, in this embodiment, the inter-layer films 14 are etched via the through-hole 17b after forming the through-hole 17b in the stacked body ML2. Thereby, each isolation dielectric film 14 is recessed at the inner face of the through-hole 17b, and each electrode film WL protrudes the same amount. As a result, the protruding portion of the electrode film WL is not readily affected by the fixed charge in the isolation dielectric film 14, and a sufficient electric field can be applied to the silicon pillar SP, i.e., the channel. Thereby, the control gate has better controllability over the channel; the ON current of the cell transistor can be increased sufficiently; and the OFF current can be cut off sufficiently. In other words, the ON/OFF characteristics of the cell transistor can be improved.

However, simply causing the electrode film WL to protrude undesirably results in a sharp corner of the jutting portion of the silicon pillar SP corresponding to the recession of the isolation dielectric film 14. In the case where such a sharp corner exists, an electric field may concentrate in the corner when a high voltage is applied between the silicon pillar SP and the electrode film WL during, for example, writing and erasing of information, resulting in dielectric breakdown of the memory film 24. Therefore, the endurance undesirably declines.

Therefore, in this embodiment, three layers of a high density film 14a, a low density film 14b, and a high density film 14a are stacked in order during the formation of the isolation dielectric film 14. The low density film 14b has an etching rate higher than that of the high density film 14a. Therefore, the middle layer (the low density film 14b) of the isolation dielectric film 14 is recessed further than the upper layer and the lower layer (the high density films 14a) by etching, and the end face of the isolation dielectric film 14 is thereby curved in a recessed configuration as viewed from the inside of the through-hole 17b. The memory film 24 is subsequently formed on the inner face of the through-hole 17b, and then amorphous silicon is filled. Thereby, the corner C1 of the jutting portion of the silicon pillar SP can be rounded.

As a result, concentration of the electric field at the corner C1 can be reduced, and the endurance improves. Thereby, the reliability of the memory film 24 improves, and a sufficient number of writes/erases is possible. Thus, according to the nonvolatile semiconductor memory device 1 according to this embodiment, good ON/OFF characteristics of the cell transistor and endurance to stress of writing/erasing can both be provided.

Although an example in which the high density film 14a and the low density film 14b are formed by different film formation methods to provide different etching rates within the isolation dielectric film 14 in this embodiment, the invention is not limited thereto. For example, the film being formed can be provided with different etching rates along the stacking direction by changing film formation conditions in the same film formation apparatus. Such a method can provide better productivity than the case where the film formation method itself is switched.

Specifically, continuous film formation is possible in the same film formation apparatus by changing the film formation temperature. Generally, the film density increases and the etching rate decreases as the film formation temperature increases. On the other hand, the film density decreases and the etching rate increases as the film formation temperature decreases. Accordingly, when forming each of the isolation dielectric films 14, the film formation temperature may be high initially, reduced once partway, and then once again increased. An isolation dielectric film 14 can thereby be formed having different etching rates by position along the stacking direction, and subsequent etching can cause the end face of the isolation dielectric film 14 to curve in a recessed configuration.

Alternatively, the etching rate can be changed by changing the supply ratio of the source gases in the same film formation apparatus. For example, increasing the supply of the silicon source and reducing the supply of the oxidizing agent results in a silicon oxide film having a silicon-rich composition and a lower etching rate. On the other hand, reducing the supply of the silicon source and increasing the supply of the oxidizing agent results in a silicon oxide film having an oxygen-rich composition and a higher etching rate.

A first comparative example of this embodiment will now be described.

Figure 9:
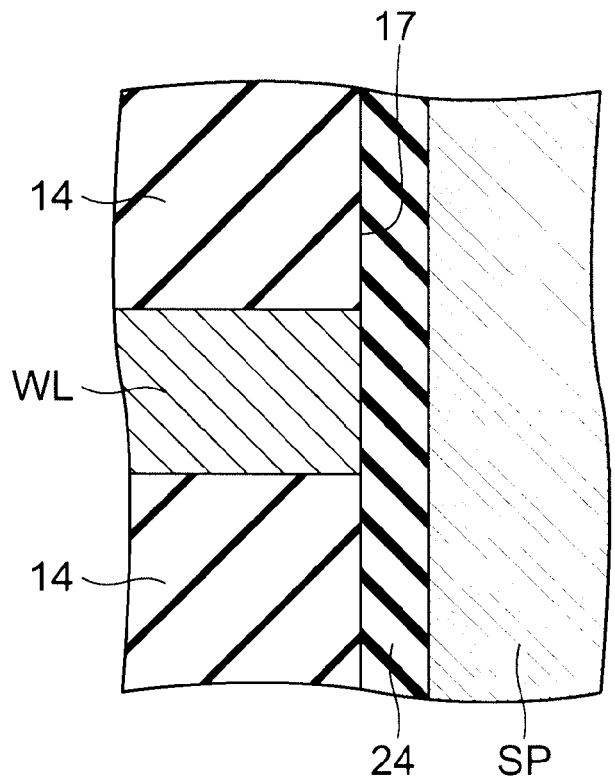
FIG. 9 is a cross-sectional view illustrating a nonvolatile semiconductor memory device according to a first comparative example of the first embodiment.

FIG. 9 is a cross-sectional view illustrating a nonvolatile semiconductor memory device according to this comparative example.

In this comparative example illustrated in FIG. 9, the electrode film WL does not protrude toward the silicon pillar SP with respect to the isolation dielectric film 14 at the inner face of the through-hole 17. In such a case, the silicon pillar SP, i.e., the channel, is affected by the fixed charge stored in the isolation dielectric film 14 in addition to the potential of the electrode film WL. Therefore, the electrode film WL has a weak controllability over the silicon pillar SP. For example, in the case where a positive fixed charge is stored in the isolation dielectric film 14, the OFF current of the cell transistor cannot be reduced sufficiently.

Conversely, according to this embodiment, the electrode film WL protrudes further than the isolation dielectric film 14 toward the silicon pillar SP side as described above. Therefore, the controllability over the channel is strong, and the cell transistor has good ON/OFF characteristics.

A second comparative example of this embodiment will now be described.

Figure 10:
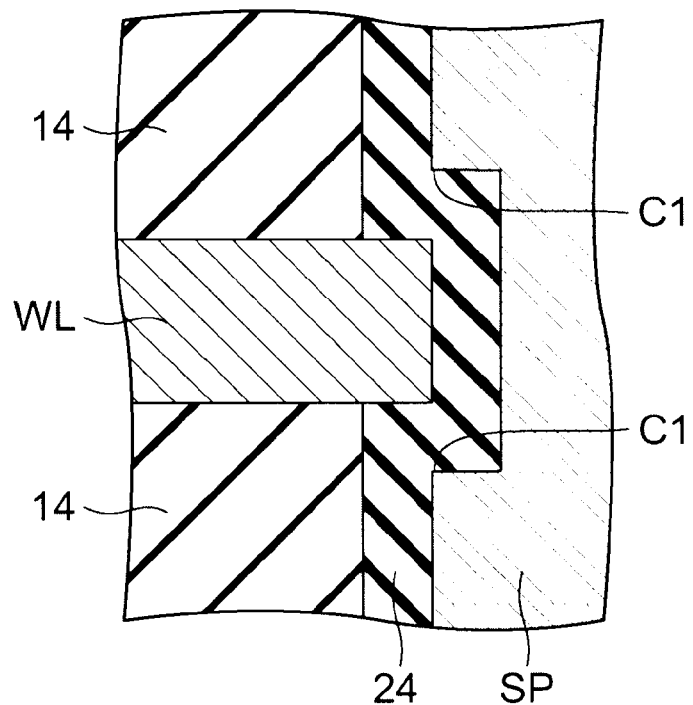
FIG. 10 is a cross-sectional view illustrating a nonvolatile semiconductor memory device according to a second comparative example of the first embodiment.

FIG. 10 is a cross-sectional view illustrating a nonvolatile semiconductor memory device according to this comparative example.

In this comparative example illustrated in FIG. 10, although the electrode film WL protrudes further than the isolation dielectric film 14 toward the silicon pillar SP side at the inner face of the through-hole 17, the corner C1 of the jutting portion of the silicon pillar SP is not rounded. In this comparative example, the film qualities of the isolation dielectric film 14 are uniform along the stacking direction. Therefore, the entire end face of the isolation dielectric film 14 is recessed uniformly when the isolation dielectric film 14 is etched. Although the electrode film WL thereby has a strong controllability over the silicon pillar SP, the corner C1 of the silicon pillar SP is sharp, and the breakdown voltage between the electrode film WL and the silicon pillar SP decreases.

Conversely, according to this embodiment, the end face of the isolation dielectric film 14 is curved in a recessed configuration as described above. Therefore, the corner C1 of the jutting portion of the silicon pillar SP is rounded. As a result, concentration of the electric field is reduced, and the breakdown voltage increases.

A variation of the first embodiment will now be described.

Figure 11:
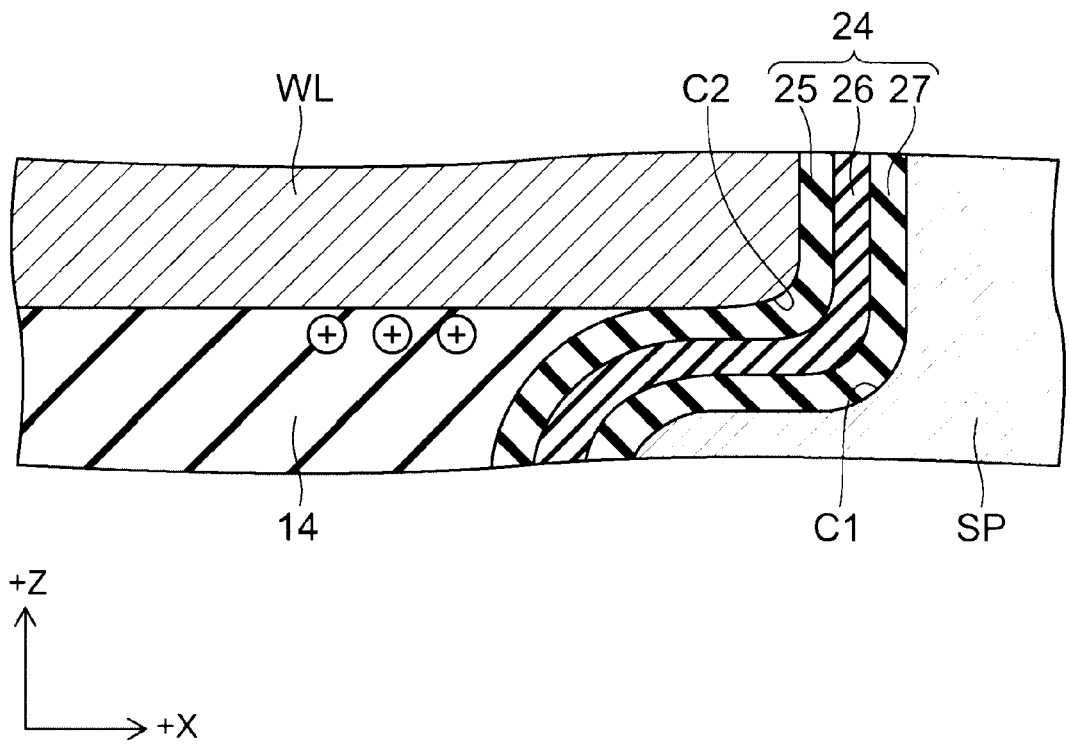
FIG. 11 is a cross-sectional view illustrating a nonvolatile semiconductor memory device according to a variation of the first embodiment.

FIG. 11 is a cross-sectional view illustrating a nonvolatile semiconductor memory device according to this variation.

As illustrated in FIG. 11, this variation differs from the first embodiment described above in that a corner C2 of the electrode film WL is rounded.

In this variation, after etching the isolation dielectric film 14 by dilute hydrofluoric acid treatment as described above, radical oxidation treatment is performed, and a silicon oxide film is formed on the surface of the electrode film WL made of polycrystalline silicon. At this time, the corners of the protruding portion of the electrode film WL oxidize more deeply than the other portions. Therefore, corners of an unoxidized portion are rounded. Then, by once again performing dilute hydrofluoric acid treatment, the silicon oxide film formed on the electrode film WL is removed to expose the unoxidized portion. Thereby, the corners C2 of the protruding portion of the electrode film WL are rounded.

According to this variation, the corner C2 of the electrode film WL is rounded in addition to a corner C1 of the silicon pillar SP. Thereby, the electric field concentration can be reduced even more. For example, the electric field concentration can be reduced also when erasing information. Thereby, even more resistance to stress during writing/erasing is provided, and the endurance improves even more. Otherwise, the configuration, manufacturing method, and effects of this variation are similar to those of the first embodiment described above.

A second embodiment of the invention will now be described.

Figure 12:
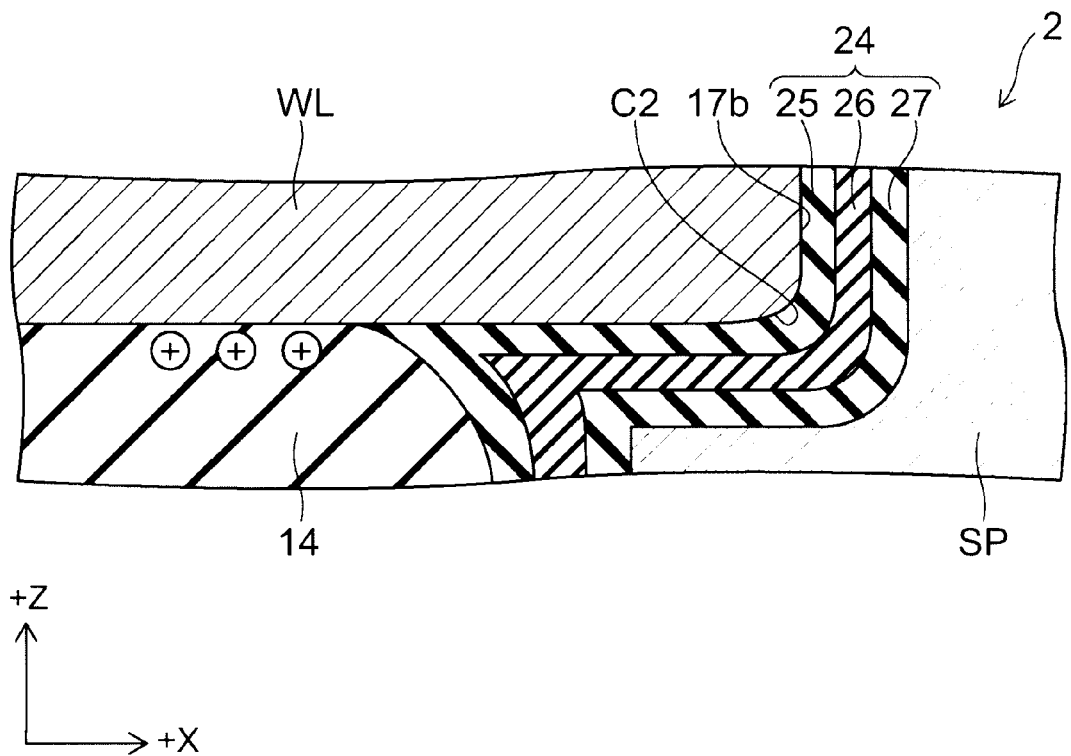
FIG. 12 is a cross-sectional view illustrating a nonvolatile semiconductor memory device according to a second embodiment of the invention.

FIG. 12 is a cross-sectional view illustrating a nonvolatile semiconductor memory device according to this embodiment.

In a nonvolatile semiconductor memory device 2 according to this embodiment illustrated in FIG. 12, similarly to the first embodiment described above, the electrode film WL protrudes further than the isolation dielectric film 14 toward the silicon pillar SP side at the inner face of the through-hole 17b. However, this embodiment differs from the first embodiment in that the end face of the portion of the isolation dielectric film 14 contacting the electrode film WL at the inner face of the through-hole 17b is positioned more distal than the end faces of the other portions as viewed from the silicon pillar SP. For example, the end face of the isolation dielectric film 14 on the silicon pillar SP side has a curved shape in a protruding configuration displacing toward a side opposite to the silicon pillar SP as the electrode film WL is approached. The corner C2 of the electrode film WL is rounded similarly to that of the variation of the first embodiment described above. Otherwise, the configuration of this embodiment is similar to that of the first embodiment described above.

A method for manufacturing the nonvolatile semiconductor memory device according to this embodiment will now be described.

Figure 13:
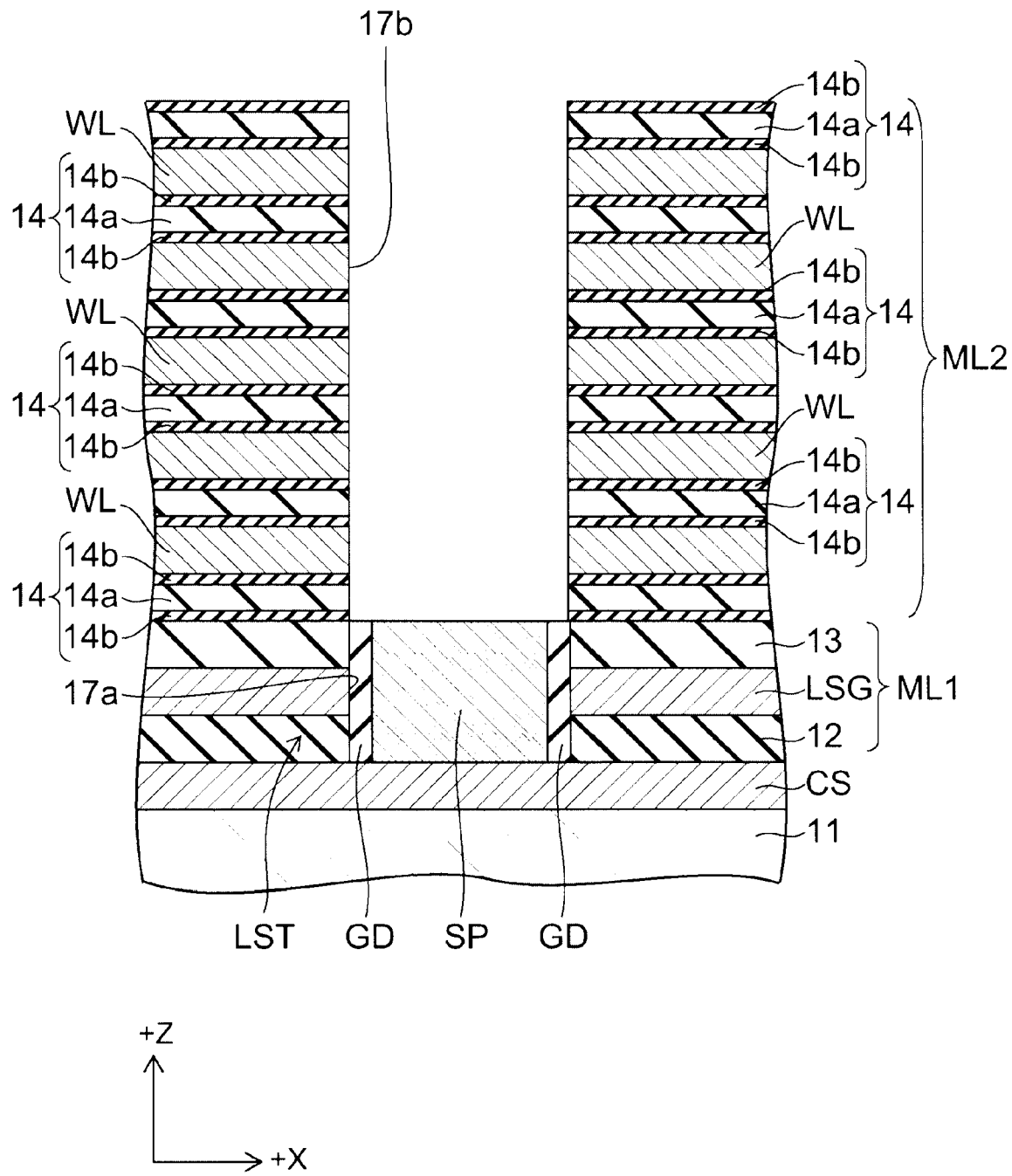
FIG. 13 is a process cross-sectional view illustrating a method for manufacturing the nonvolatile semiconductor memory device according to the second embodiment.

FIG. 13 is a process cross-sectional view illustrating the method for manufacturing the nonvolatile semiconductor memory device according to this embodiment.

Figure 14A:
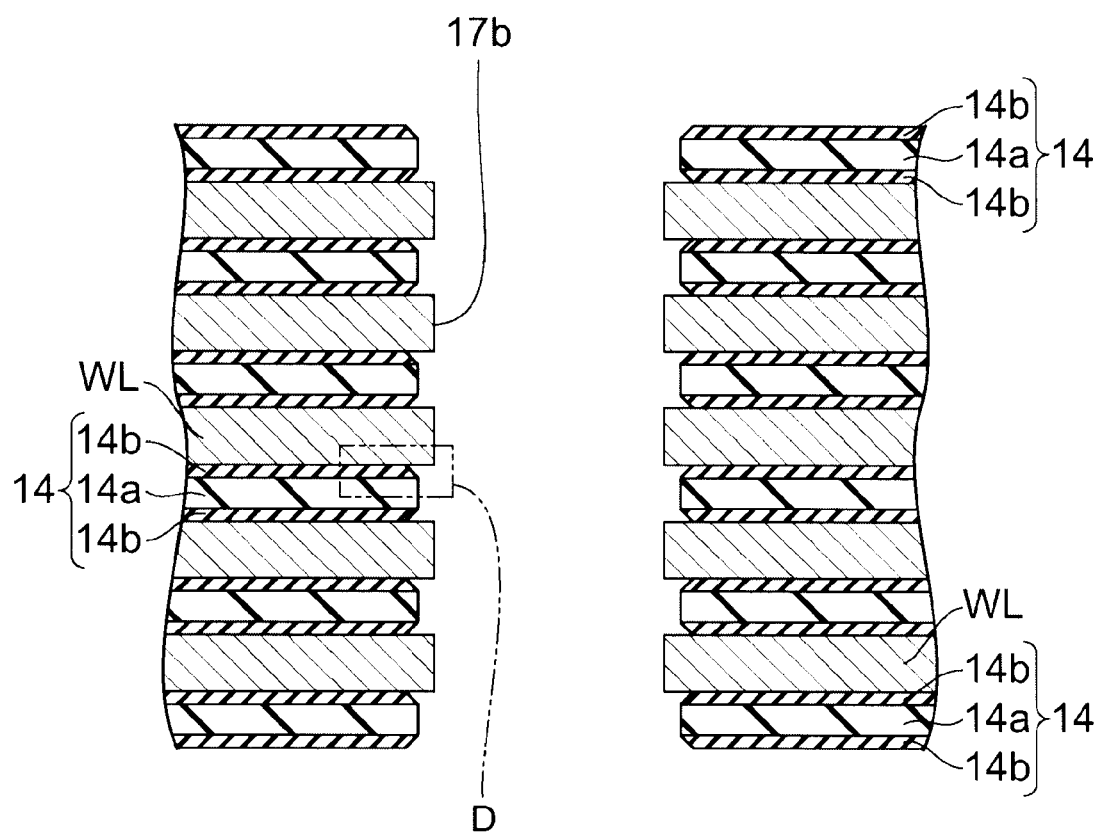
FIG. 14A is a process cross-sectional view illustrating the method for manufacturing the nonvolatile semiconductor memory device according to the second embodiment.
Figure 14B:
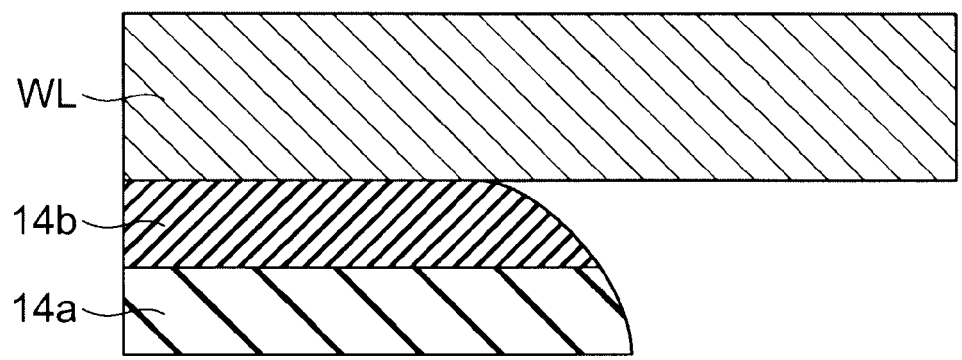
FIG. 14B is a partially enlarged cross-sectional view illustrating the portion D of FIG. 14A.

FIG. 14A is a process cross-sectional view illustrating the method for manufacturing the nonvolatile semiconductor memory device according to this embodiment. FIG. 14B is a partially enlarged cross-sectional view illustrating the portion D of FIG. 14A.

As illustrated in FIG. 13, the method for manufacturing the nonvolatile semiconductor memory device according to this embodiment differs from that of the first embodiment described above in that the stacking method of the isolation dielectric films 14 is different. In other words, in this embodiment, three layers of a low density film 14b, a high density film 14a, and a low density film 14b are stacked in order to form each of the isolation dielectric films 14. The film formation methods of the low density film 14b and the high density film 14a are similar to those described in regard to the first embodiment described above.

As illustrated in FIGS. 14A and 14B, the etching rate of the low density film 14b is thereby higher than that of the high density film 14a during etching of the isolation dielectric film 14 via the through-hole 17b. Therefore, the low density film 14b is etched more. As a result, the end faces of the upper layer and the lower layer of the isolation dielectric film 14 formed of the low density films 14b are recessed more than the end face of the middle layer formed of the high density film 14a, and the entire end face of the isolation dielectric film 14 is curved in a protruding configuration. Then, as illustrated in FIG. 12, radical oxidation of the electrode film WL is performed, dilute hydrofluoric acid treatment is then performed, and the corner C2 of the electrode film WL is thereby rounded. Otherwise, the manufacturing method of this embodiment is similar to the manufacturing method of the first embodiment described above.

Effects of this embodiment will now be described.

According to this embodiment, the electrode film WL protrudes and the upper layer and the lower layer of the isolation dielectric film 14 contacting the electrode film WL are more recessed at the inner face of the through-hole 17b. Thereby, effects due to the fixed charge in the isolation dielectric film 14 can be effectively inhibited. As a result, the ON/OFF characteristics of the cell transistor improve even more. The corner C2 of the electrode film WL is rounded. Thereby, the electric field concentration during writing/erasing can be reduced, and the endurance can be increased.

Hereinabove, the invention is described with reference to embodiments. However, the invention is not limited to these embodiments. For example, all additions, deletions, or design modifications of components or additions, omissions, or condition modifications of processes appropriately made by one skilled in the art in regard to the embodiments described above are within the scope of the invention to the extent that the purport of the invention is included.

For example, in the embodiments described above, an example is illustrated in which the entire silicon pillar has a circular columnar configuration. However, the configuration of the silicon pillar may be a forward-taper configuration which is fine at the lower portion and broad at the upper portion, or a reversed-taper configuration which is broad at the lower portion and fine at the upper portion. In the embodiments described above, an example is illustrated in which the isolation dielectric film is formed of silicon oxide. However, the invention is not limited thereto. The isolation dielectric film may be formed of an insulating film other than silicon oxide. In such a case as well, the end face of the isolation dielectric film can be configured such as those of the embodiments described above by stacking a combination of a film having a relatively high etching rate and a film having a relatively low etching rate.

The invention claimed is:

1. A nonvolatile semiconductor memory device, comprising:
   a substrate;
   a stacked body provided on the substrate and including alternately stacked pluralities of isolation dielectric films and electrode films, a through-hole being formed in the stacked body to extend in the stacking direction;
   a semiconductor pillar buried in the through-hole; and
   a charge storage layer provided between the electrode films and the semiconductor pillar,
   the isolation dielectric film including:
   a first high density film;
   a low density film provided on the first high density film, the low density film being less dense than the first high density film; and
   a second high density film provided on the low density film, the second high density film being denser than the low density film, and
   the electrode film protruding further than the isolation dielectric film toward the semiconductor pillar at an inner face of the through-hole, an end face of the isolation dielectric film having a curved shape displacing toward the semiconductor pillar side as the electrode film is approached.

2. The device according to claim 1, wherein a jutting portion of the semiconductor pillar is enclosed by the isolation dielectric film, and the jutting portion juts further toward the outside of the semiconductor pillar than a portion enclosed by the electrode film.

3. The device according to claim 2, wherein a corner of the jutting portion is rounded.

4. The device according to claim 1, wherein the isolation dielectric film is made of silicon oxide and contains at least one of carbon and nitrogen as an unavoidable impurity.

5. The device according to claim 1, wherein a corner of the electrode film at the inner face of the through-hole is rounded.

6. The device according to claim 5, wherein the isolation dielectric film is made of silicon oxide and contains at least one of carbon and nitrogen as an unavoidable impurity.

7. A nonvolatile semiconductor memory device, comprising:
   a substrate;
   a stacked body provided on the substrate and including alternately stacked pluralities of isolation dielectric films and electrode films, a through-hole being formed in the stacked body to extend in the stacking direction;
   a semiconductor pillar buried in the through-hole; and
   a charge storage layer provided between the electrode films and the semiconductor pillar,
   the isolation dielectric film including:
   a first high density film;
   a low density film provided on the first high density film, the low density film being less dense than the first high density film; and
   a second high density film provided on the low density film, the second high density film being denser than the low density film, and
   the electrode film protruding further than the isolation dielectric film toward the semiconductor pillar at an inner face of the through-hole, a corner of the electrode film being rounded.

8. The device according to claim 7, wherein the isolation dielectric film is made of silicon oxide and contains at least one of carbon and nitrogen as an unavoidable impurity.

* * * * *